(12) United States Patent
Grundy et al.

(10) Patent No.: US 7,280,372 B2
(45) Date of Patent: Oct. 9, 2007

(54) STAIR STEP PRINTED CIRCUIT BOARD STRUCTURES FOR HIGH SPEED SIGNAL TRANSMISSIONS

(75) Inventors: Kevin P. Grundy, Fremont, CA (US); William F. Wiedemann, Campbell, CA (US); Joseph C. Fjelstad, Maple Valley, WA (US)

(73) Assignee: Silicon Pipe, San Jose, CA (US)

( * ) Notice: Subject to any disclaimer, the term of this patent is extended or adjusted under 35 U.S.C. 154(b) by 228 days.

(21) Appl. No.: 10/990,280

(22) Filed: Nov. 15, 2004

(65) Prior Publication Data

US 2005/0103522 A1   May 19, 2005

Related U.S. Application Data

(60) Provisional application No. 60/519,902, filed on Nov. 13, 2003.

(51) Int. Cl.
*H05K 1/11* (2006.01)
(52) U.S. Cl. ............................................. 361/792
(58) Field of Classification Search ................ 361/753, 361/752, 761; 174/251
See application file for complete search history.

(56) References Cited

U.S. PATENT DOCUMENTS

| | | | |
|---|---|---|---|
| 3,349,162 A * | 10/1967 | Eckhardt et al. ............. 174/266 |
| 3,400,210 A * | 9/1968 | Reimer .......................... 174/266 |
| 3,432,796 A * | 3/1969 | Reimer ............................. 439/85 |
| 3,777,221 A * | 12/1973 | Tatusko et al. ................ 361/761 |
| 4,201,432 A * | 5/1980 | Chalmers ........................ 439/82 |
| 4,691,972 A | 9/1987 | Gordon |
| 5,373,109 A | 12/1994 | Argyrakis et al. |
| 5,475,264 A | 12/1995 | Sudo et al. |
| 5,530,287 A | 6/1996 | Currie et al. |
| 5,543,586 A | 8/1996 | Crane, Jr. et al. |
| 5,623,160 A | 4/1997 | Liberkowski |
| 5,701,233 A | 12/1997 | Carson et al. |
| 5,712,767 A * | 1/1998 | Koizumi ..................... 361/761 |
| 5,821,457 A | 10/1998 | Mosley et al. |
| 5,906,948 A | 5/1999 | Liu et al. |
| 5,969,421 A | 10/1999 | Smooha |
| 6,001,671 A | 12/1999 | Fjelstad |
| 6,020,559 A | 2/2000 | Maeda |
| 6,054,652 A | 4/2000 | Moriizumi et al. |
| 6,055,722 A | 5/2000 | Tighe et al. |
| 6,175,161 B1 * | 1/2001 | Goetz et al. ................. 257/780 |
| 6,249,439 B1 * | 6/2001 | DeMore et al. ............. 361/752 |
| 6,284,984 B1 | 9/2001 | Ohyama |
| 6,369,454 B1 | 4/2002 | Chung |

(Continued)

FOREIGN PATENT DOCUMENTS

JP          09-246684 A       9/1997

OTHER PUBLICATIONS

Written Opinion of International Search Authority for PCT/US04/38286 to Kevin P. Grundy

*Primary Examiner*—Dean A. Reichard
*Assistant Examiner*—Abiy Getachew
(74) *Attorney, Agent, or Firm*—Ronald R. Shea

(57) ABSTRACT

Disclosed are stair stepped PCB structures which provide high performance, direct path, via-less interconnections between various elements of an electronic interconnection structure including, among others, IC packages and connectors.

19 Claims, 5 Drawing Sheets

U.S. PATENT DOCUMENTS

| | | |
|---|---|---|
| 6,421,254 B2 | 7/2002 | Crane, Jr. et al. |
| 6,440,770 B1 | 8/2002 | Banerjee et al. |
| 6,441,498 B1 | 8/2002 | Song |
| 6,459,593 B1 * | 10/2002 | Kwong ................. 361/761 |
| 6,538,310 B2 | 3/2003 | Hoshino et al. |
| 6,555,919 B1 | 4/2003 | Tsai et al. |
| 6,635,957 B2 | 10/2003 | Kwan et al. |
| 6,680,530 B1 | 1/2004 | Pillai et al. |
| 6,777,795 B2 | 8/2004 | Sasakura et al. |
| 6,900,390 B2 | 5/2005 | Halter |
| 6,900,528 B2 | 5/2005 | Mess et al. |
| 2002/0070446 A1 | 6/2002 | Horiuchi et al. |
| 2003/0218191 A1 | 11/2003 | Nordal et al. |

* cited by examiner

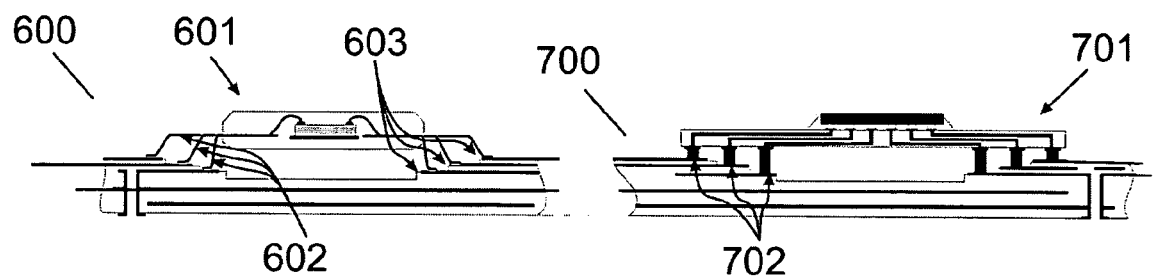
Figure 6
Figure 7
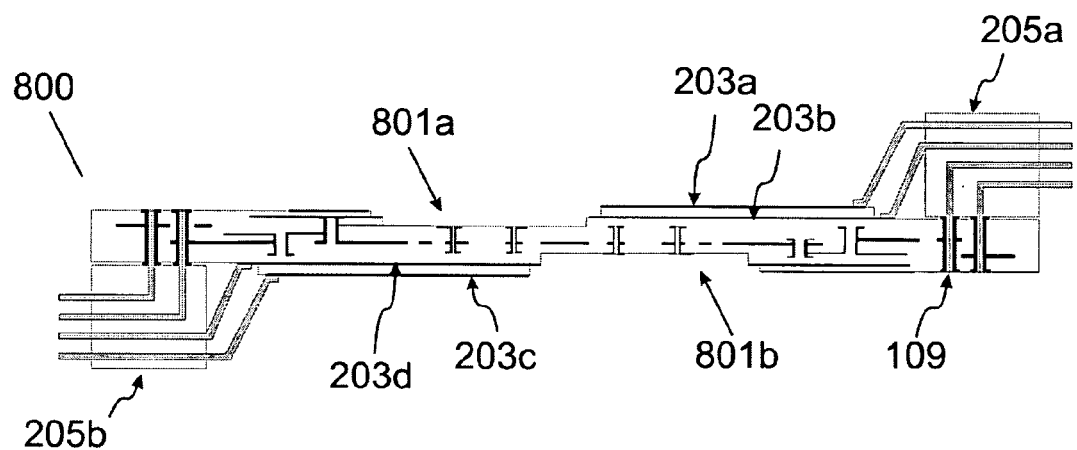
Figure 8

STAIR STEP PRINTED CIRCUIT BOARD STRUCTURES FOR HIGH SPEED SIGNAL TRANSMISSIONS

CROSS-REFERENCE TO RELATED APPLICATIONS

This application claims priority from, and hereby incorporates by reference, U.S. Provisional Application No. 60/519,902, filed Nov. 13, 2003 and entitled: "Structures and Methods for Stair Step Printed Circuit Board to Facilitate High Speed Signal Transmissions."

FIELD OF THE INVENTION

The present invention relates to the field of high speed electronic interconnections and the packaging of semiconductor integrated circuits for use therewith.

BACKGROUND

Since the development of the integrated circuit there has been a constant increase in the speed of electronic signals brought on by the continuous increases in transistor density in semiconductor process. While the needs of electronic signals were successfully handled by traditional methods of IC packaging and interconnection for most of the history that followed the introduction of the IC, beginning in the late 1990s it was becoming increasingly clear that traditional approaches would reach a point where they could no longer deliver the performance needs of the signal. Today, semiconductor technology has finally pushed the limits of traditional IC packaging, printed boards and connector technology to the point where the current construction techniques can no longer provide adequate signal quality.

For current and foreseeable future generations of electronic systems, controlling signal loss and the impedance of signal traces has become the key area of focus for the electronic system designer intent on transmitting electrical signals in the gigahertz range. The approach to date for IC chip packaging and printed circuit board design to address the problem has been to make incremental changes in material choice and design and supplement those choices with sophisticated semiconductor electronics that pre and/or post emphasize the signal and to employ higher power to overcome the losses associated with the parasitic effects of present design and manufacturing practices. To gage the size of the gap, one can look at current generation IC microprocessors which are operating at near 4 gigahertz while the PCB bus which serves them operate at only 800 MHz.

Included among those features that can have deleterious effects are abrupt transitions and features such as plated vias which alter the capacitance in mid run creating signal discontinuities and their stubs which cause reflections and electronic noise. Thus plated vias, solder balls and trace transitions between layers all introduce deleterious impedance changes resulting in poor signal quality. This limits overall signal speed.

While their have been attempts to minimize the parasitic effects of circuit design elements, adjustments so far have yielded only marginal benefit and there is opportunity and need to improve on current design and manufacturing approach to meet the pending demand for a significant magnitude leap in performance required for next generation electronic systems. However, if one can eliminate or severely limit or mitigate the use of vias, solder balls and trace transitions, a printed circuit board is capable of supporting much higher signal speeds with less signal degradation.

BRIEF DESCRIPTION OF THE DRAWINGS

The present invention is illustrated by way of example, and not by way of limitation, in the figures of the accompanying drawings and in which like reference numerals refer to similar elements and in which:

FIG. 6 illustrates an embodiment of stair stepped PCB with and modified standard IC package disposed to connection with the stair steps;

FIG. 7 illustrates another embodiment of stair stepped PCB with and modified standard IC package disposed to connection with the stair steps; and FIG. 8 of another embodiment of stair stepped PCB having cavities and connectors on both sides and more than one edge.

DETAILED DESCRIPTION

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa.

The present disclosure provides examples of embodiments of electronic interconnection structures which are designed to preclude the introduction of vias in the electrical path of critical electronic signals. The embodiments disclosed take advantage of the ability for printed circuit boards (PCBs) to be constructed with openings, or cutouts which expose traces on different layers of the PCB, creating a tiered or "stair step-like" structure in the PCB and dispose them for direct interconnection to other electronic elements such as IC packages and connectors.

It is thus an objective of these embodiments to provide a "via-less" interconnection path between electronic devices and interconnection elements in an electronic assembly to overcome one of the serious challenges associated with design of high performance electronic signaling systems needed for products such as product boards, backplane, daughter cards and other electronic interconnection structures that can be served by via-less interconnections. It is another objective of this disclosure to further describe embodiments of interconnections can be made between these stair steps and those electronic devices, components and connectors that benefit from the direct path interconnection offered. It is another objective to create structures that facilitate the design of interconnection paths which have substantially equal length and thus virtually no signal skew.

Figure 1:
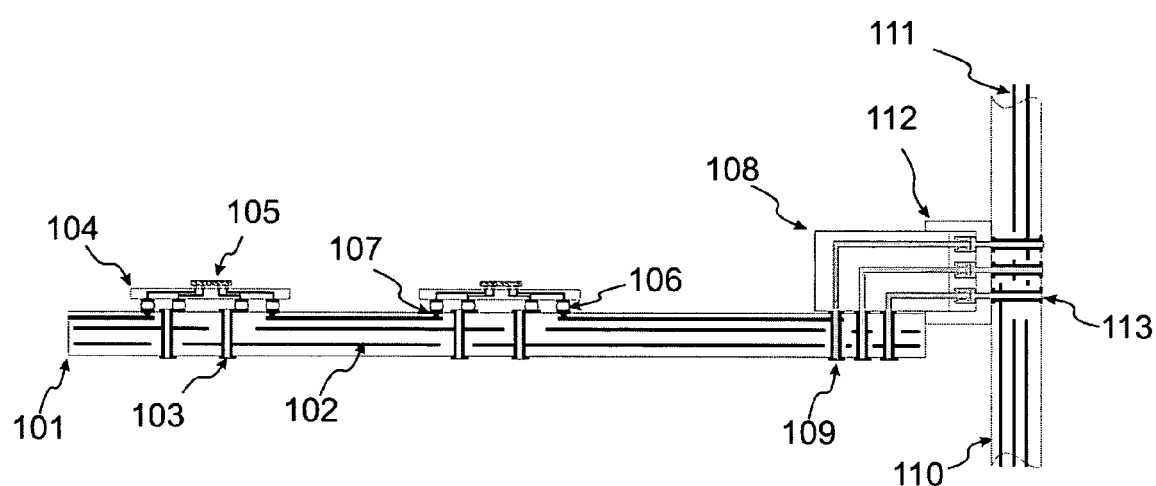
FIG. 1 illustrates a typical prior art printed circuit board with an integrated circuit package connected to a backplane by a typical connector pair.

FIG. 1 illustrates an example of prior art, comprising a traditional multilayer printed circuit card 101 with internal circuits layers 102 interconnected by means of plated through hole vias 103 and plated blind vias 107 to bring the signals routed on internal layers to the outer surfaces of the structure where IC packages 104, The IC packages support and interconnect IC die 105 are interconnected to the PCB by a suitable means such as a solder joint 106. A connector 108 having press fit or soldered signal pins that serve as male connections 109 are normally placed in plated through holes and it is commonly used to provide interconnection to a next level interconnection device such as a backplane 111 having a mating connector 112 which has press fit or soldered pins that serve as female contacts 113.

Figure 2:
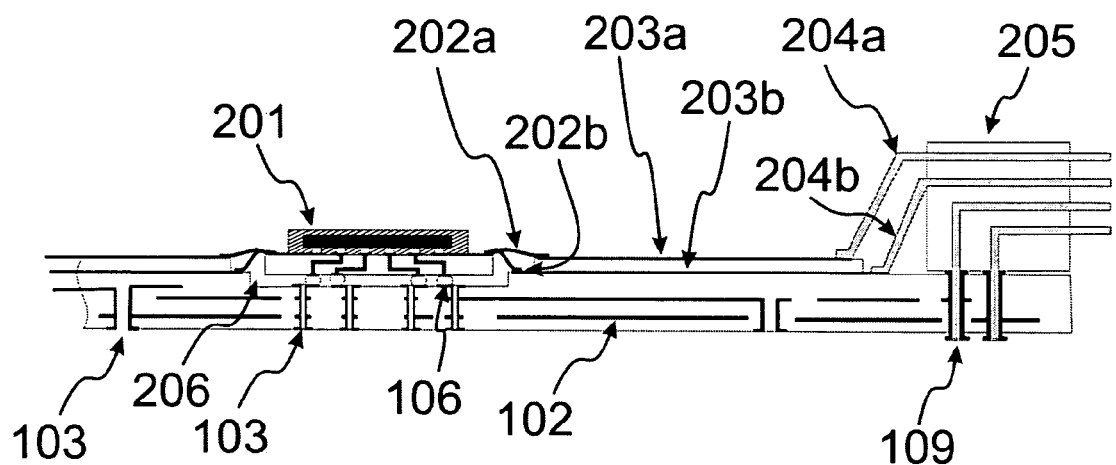
FIG. 2 illustrates a side view of an embodiment of a printed circuit board constructed with a stair step cavity for integrated circuit packages having both top and bottom surface connections and a stair stepped card edge for a backplane connector.

FIG. 2 illustrates in cross section an embodiment wherein a partial section of a interconnection structure, such as a multilayer PCB assembly 200. The structure has an IC package 201 residing in a cavity 206 an interconnected to terminations on the cavity floor by a suitable means, such as a solder ball 106. Interconnections made on the cavity floor are generally reserved for signals not requiring careful impedance control such as power and ground, however, in cases where a chip package resides on the side opposite, high speed signals may be interconnected by means of plated through vias.

The IC package has additional terminations on its top surface and these are interconnected to stair step terminations 202a and 202b by a suitable means such as a controlled impedance flex circuit or short discrete wires which bridge the gap and provide a clean signal path. The signals are transmitted directly, without vias, through circuits, which are preferably controlled impedance circuits, on different layers 203a and 203b to distal similarly stair stepped terminations where they are connected directly to connector conductor elements 204a and 204b located in a suitable connector such as the embodiment 205 and which are capable of making reliable connection to the stair stepped terminations on the PCB. While the connector 205 is shown with both plated through hole and direct contacts, it is not so limited.

Figure 3:
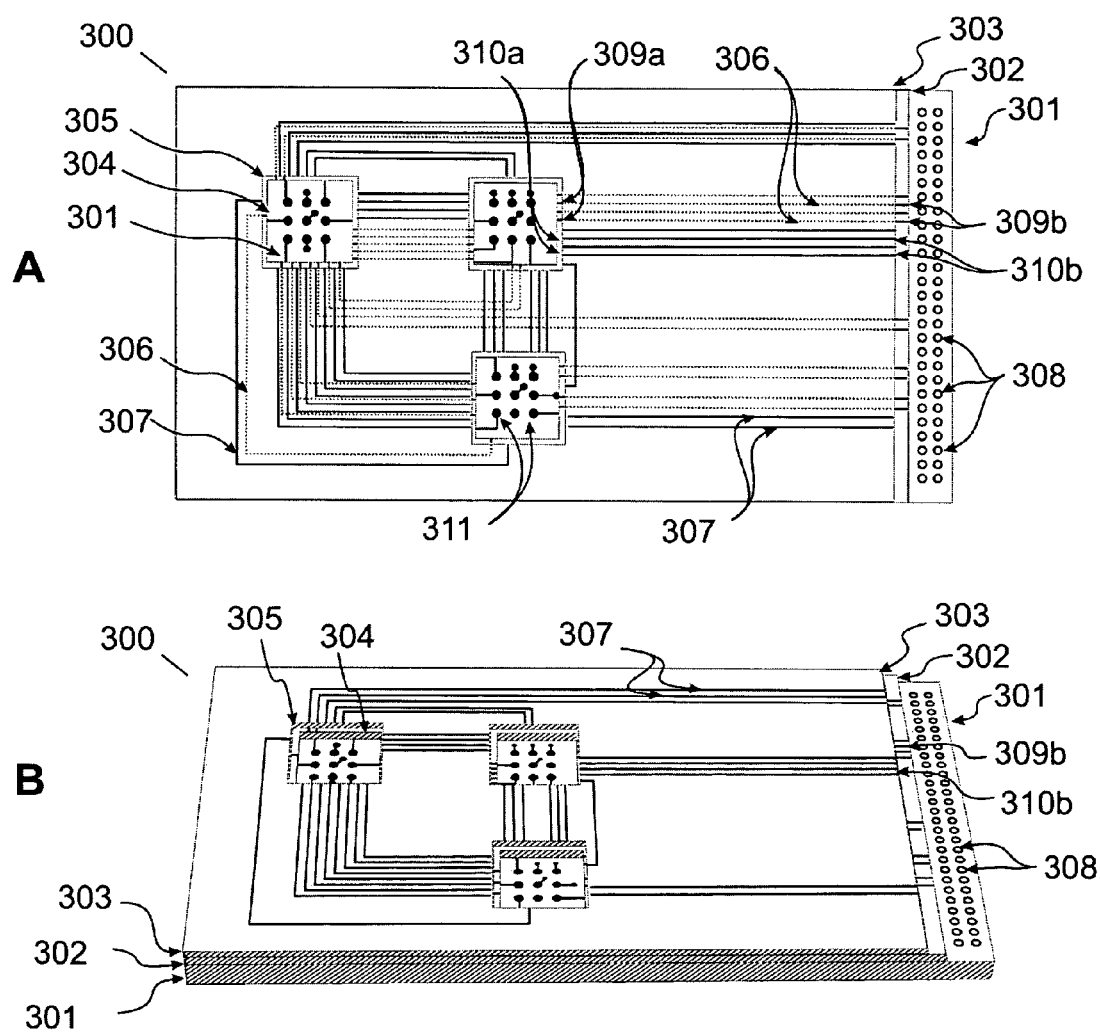
FIGS. 3A and B illustrate of top and perspective views of an embodiment of a printed circuit board constructed with a stair step cavity for integrated circuits and a stair stepped card edge area for a backplane connector.

FIGS. 3A and B illustrate a top and perspective views of an embodiment of a PCB structure with stair steps 300 without chip packages or connectors. In the illustration, a base PCB of substantially normal construction, 301, has additional circuit layers, 302 and 303, affixed and these have respective cavities, 304 and 305, which expose and provide access to the base PCB 301 and any electrical terminations 311 there by made available. Via-less interconnection paths 306 and 307 are disposed on the circuit layers 302 and 303 respectively. The via-less interconnection paths 306 and 307 are disposed on the circuit layers 302 and 303 circuits have terminations at both ends. In the FIG. 3A stair stepped terminations for making connection to an IC package 309a and 310a are disposed to interconnect to an edge connector at stair stepped terminations 309b and 310b respectively. Connection can be made to the connector as described or to other circuit devices such as other IC chip packages. In FIG. 3A, the circuits on circuit layer 302 are shown as phantom lines 306 in the areas where they are covered by circuit layer 303 but are shown as solid lines where the egress to exposed termination points. The stair stepped PCB may have plated through holes 308 to accept a pin-in-hole connector that can be either separate or integrated as illustrated in FIG. 2.

Figure 4:
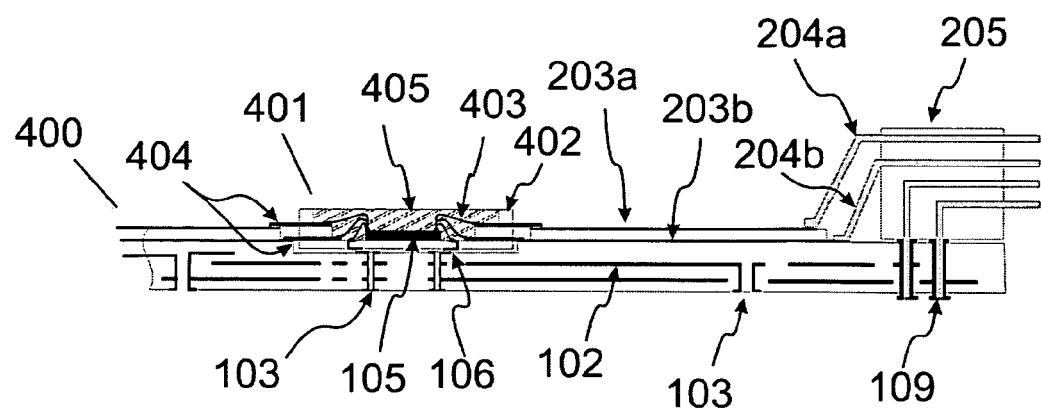
FIG. 4 illustrates an embodiment of stair stepped PCB with and IC package disposed to connection with the stair steps.

FIG. 4 provides a cross section view of another embodiment of a package and stair stepped PCB structure 400 wherein an IC package 401 having stacked and stair stepped contacts 404 such as which can be created by stacking lead frames in a common package and which egress from its body 402 for interconnection to the stair stepped PCB terminals. Inside the package, an IC die 105 is interconnected by wires 403 and the die and wires are encapsulated with a suitable encapsulant material 405.

Figure 5:
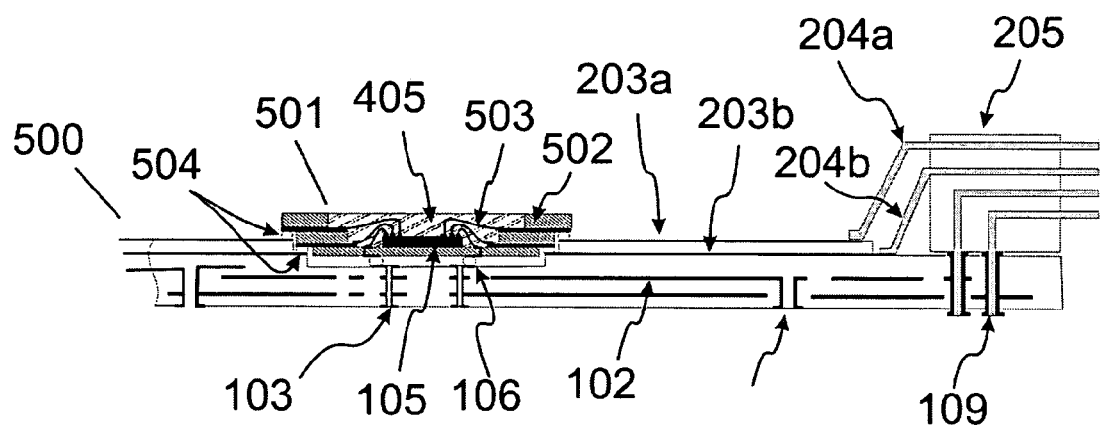
FIG. 5 illustrates another embodiment of stair stepped PCB with and IC package disposed to connection with the stair steps.

In FIG. 5 is illustrated a cross section view of another embodiment of a package and stair stepped PCB assembly structure 500 wherein an IC package 501 having stacked and stair stepped contacts 504 such as which can be created by laminating metal clad laminates 502, or else wise manufacture a device that allows package circuit traces to accessed from both sides of the metal at their distal ends to allow stair stepped access for assembly to a stair stepped PCB. The terminations on the IC die 105 are interconnected by wires 503 to the different stair stepped layers of the IC package and encapsulated with a suitable encapsulant 405.

In FIG. 6 is illustrated a cross section view of another embodiment of a package and stair stepped PCB assembly structure 600 wherein an leaded IC package 601 such as a DIP, SOIC, QFP or the like, has its leads 602, formed and shaped to allow interconnection to stair stepped contacts 603.

In FIG. 7 is illustrated a cross section view of another embodiment of a package and stair stepped PCB assembly structure 700 wherein an area array IC package 701 such as a ball grid array (BGA), column grid array (CGA) or the like, has its terminations 702, formed or shaped to allow interconnection to stair stepped contacts.

FIG. 8 provides an illustration of a cross section view of another embodiment of a PCB and connector assembly with stair stepped interconnections 800. In the figure stair stepped cavities 801a and 801b, with stair stepped interconnections exposed, are disposed on opposite sides of the PCB connector assembly structure. Connectors 205a and 205b are shown interconnected to the stair step PCB on distal ends of the structure. While the figure shows connectors at ends only, they are not so limited and can be located anywhere on the stair stepped PCB.

Although the invention has been described with reference to specific exemplary embodiments thereof, it will be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An electrical assembly with a circuit board and at least one integrated circuit package coupled to the circuit board, the electrical assembly comprising:
   a first dielectric layer;
   a second dielectric layer with a first surface and a second surface, the first surface disposed adjacent the first dielectric layer, the second dielectric layer having first and second apertures therein to expose respective first and second regions of the first dielectric layer;
   a first plurality of signal conductors disposed between the first and second dielectric layers and extending from the exposed first region of the first dielectric layer to the exposed second region of the first dielectric layer;

a second plurality of signal conductors disposed on the second surface of the second dielectric layer and extending from a periphery of the first aperture to a periphery of the second aperture, the second plurality of signal conductors being electrically isolated from the first plurality of signal conductors; and a first integrated circuit package disposed within the first aperture.

2. The electrical assembly of claim 1 wherein the first integrated circuit device includes an electrical contact electrically coupled with a signal conductor from among the first plurality of signal conductors.

3. The electrical assembly of claim 2 wherein at least one of the first and second apertures is polygon.

4. The electrical assembly of claim 2 further comprising a second integrated circuit device disposed in the second aperture.

5. The electrical assembly of claim 2 wherein the first integrated circuit device comprises a second contact electrically coupled with an electrical conductor from among the second plurality of signal conductors.

6. The electrical assembly of claim 1 wherein the first dielectric layer further comprises a third aperture disposed substantially concentric with the first aperture of the second dielectric layer.

7. The electrical assembly of claim 6 wherein the third aperture is smaller than the first aperture such that the exposed first region of the first dielectric layer has an area defined by the area of the first aperture minus the area of the third aperture.

8. The electrical assembly of claim 6 further comprising a multi-layer substrate having a third plurality of signal conductors disposed therein, and wherein the first dielectric layer is disposed on a first surface of the multi-layer substrate.

9. The electrical assembly of claim 8 wherein the third plurality of signal conductors comprise a plurality of conductive vias within an area bounded by the first aperture and the third aperture.

10. The electrical assembly of claim 7 further comprising:
a third dielectric layer having opposite first and second surfaces, and wherein the first dielectric layer is disposed on the first surface of the third dielectric layer; and
a third plurality of signal conductors disposed on the first surface of the third dielectric layer, each of the third plurality of signal conductors having a respective first end within an area bounded by the third aperture.

11. The electrical assembly of claim 10 further comprising:
a fourth aperture formed within the third dielectric layer;
a fourth dielectric layer having a first surface facing the second surface of the third dielectric layer; and
a fourth plurality of signal conductors disposed on the first surface of the fourth dielectric and having respective first ends disposed within an area of the fourth aperture.

12. An electronic interconnection assembly comprising:
a plurality of electrically separate signal conductors disposed on a plurality of layers of a stair stepped printed circuit board (PCB), including a first signal conductor disposed on a first layer and having first and second ends extending into respective first and second stair stepped regions to form first and second stair stepped contacts, and a second signal conductor disposed on a second layer having first and second ends respectively extending into the first and second stair step regions to form third and fourth stair stepped contacts;

a first integrated circuit package having first and second terminals respectively coupled with the first and third contacts; and an electronic component having third and fourth terminals respectively coupled with the second and fourth contacts.

13. The electronic interconnection assembly of claim 12 wherein the first and second terminals are stair stepped contacts which are disposed to mate with the first and third stair stepped contacts on the PCB.

14. The electronic interconnection assembly of claim 12 wherein the first integrated and second terminals are coupled with the stair stepped contacts on the PCB by flexible couplings.

15. The electronic interconnection assembly of claim 12 wherein the electronic components comprises a second integrated circuit package.

16. The electronic interconnection assembly of claim 12 wherein the electronic component comprises an electronic connector.

17. An electronic connector comprising:
a first plurality of terminations configured for pin-in-hole connection to a printed circuit board (PCB); and
a second plurality of terminations configured for stair stepped connection to the PCB, wherein the first plurality of terminations comprise conductive pins that extend from a first surface of the electronic connector for insertion into holes in the circuit board (PCB); and
wherein the second plurality of terminations comprise conductive fingers that extend from a second surface of the electronic connector to contacts disposed at different elevations on the PCB.

18. A method of fabricating an electrical assembly, the method comprising:
disposing a first plurality of signal conductors on a surface of a first dielectric layer, the first plurality of signal conductors extending from a first region of the first dielectric layer to a second region of the first dielectric layer;
coupling a first surface of a second dielectric layer to the first dielectric layer over the first plurality of signal conductors, the second dielectric layer having first and second apertures therein the expose the first plurality of signal conductors at the first and second regions of the first dielectric layer;
disposing a second plurality of signal conductors on a second surface of the second dielectric layer, the second plurality of signal conductors extending from the first aperture to the second aperture;
coupling at least part of an IC package within the first aperture, wherein the first plurality of signal conductors are not electrically coupled with the second plurality of signal conductors;
electrically coupling first and second IC terminals of the IC package to corresponding first and second signal conductors among the first plurality of signal conductors; and
electrically coupling third and fourth IC terminals of the IC package to corresponding third and fourth signal conductors among the second plurality of signal conductors.

19. The electrical assembly of claim 3 wherein at least one of the first and second apertures is a rectangular polygon.

* * * * *